United States Patent [19]
Koh et al.

[11] Patent Number: 5,436,864
[45] Date of Patent: Jul. 25, 1995

[54] SEMICONDUCTOR MEMORY DEVICE HAVING AN IMPROVED DATA TRANSMISSION CIRCUIT

[75] Inventors: Hwa S. Koh; Ho K. Kim, both of Ichon-kun, Rep. of Korea

[73] Assignee: Hyundai Electronics Industries, Co., Ltd., Kyoungki-Do, Rep. of Korea

[21] Appl. No.: 172,570

[22] Filed: Dec. 22, 1993

[30] Foreign Application Priority Data

Dec. 31, 1992 [KR] Rep. of Korea ............. 1992-27086

[51] Int. Cl.6 ............................................ G11C 7/00
[52] U.S. Cl. ............................. 365/189.11; 365/190
[58] Field of Search ............... 365/189.11, 190, 189.01

[56] References Cited

U.S. PATENT DOCUMENTS

| | | | |
|---|---|---|---|
| 4,618,785 | 10/1986 | Van Tran | 365/190 X |
| 4,791,613 | 12/1988 | Hardee | 365/190 |
| 4,866,674 | 9/1989 | ran | 365/189.11 |
| 4,954,992 | 9/1990 | Kumanoya et al. | 365/190 |
| 4,961,168 | 10/1990 | Tran | 365/189.11 |

Primary Examiner—Joseph A. Popek
Assistant Examiner—Son Dinh
Attorney, Agent, or Firm—Morgan & Finnegan

[57] ABSTRACT

A semiconductor memory device having an improved data transmission circuit reduces voltage swing width of data to be transmitted from a plurality of memory cells to an output buffer, so as to improve data reading speed. To do this, the semiconductor memory device has the plurality of memory cells for storing data, true and complementary data transmission lines for transmitting true and complementary data read from the plurality of memory cells to the output buffer, a first voltage source for supplying a first voltage level to the true and complementary data transmission lines, a first level shifter connected between true data transmission line and a second voltage source generating a second voltage level for shifting a first voltage level of true data transmission line to a third voltage level by true data of a predetermined logic value supplied from the plurality of memory cells, and a second level shifter connected between the complementary data transmission line and the second voltage source for shifting a first voltage level of complementary data transmission line to a third voltage level by complementary data of a predetermined logic value supplied from the plurality of memory cells.

6 Claims, 6 Drawing Sheets

SEMICONDUCTOR MEMORY DEVICE HAVING AN IMPROVED DATA TRANSMISSION CIRCUIT

BACKGROUND OF THE INVENTION

The present invention relates to a semiconductor memory device having a data transmission circuit for transmitting data read out from memory cells to an output buffer via data transmission lines, and more particularly to a semiconductor memory device having an improved data transmission circuit for improvement of data reading time.

General semiconductor memory devices such as DRAM(Direct Random Access Memory), EPROM-(Erasable Programmable Read Only Memory), SRAM(Static Random Access Memory) have a data transmission line for transmitting data read out from a plurality of memory cells to an output buffer. Since the data transmission line is in form a relatively long length for receiving data from the plurality of memory cells, it has capacitance impedance and resistance impedance, The resistance impedance of the data transmission line increases the voltage of data signal to be transmitted to the output buffer. The capacitance impedance of the data transmission line delays the data signal to be transmitted to the output buffer. The high voltage of data signal and the delay of data signal makes a driver connected between the data transmission line and the memory cell have a transistor with a large channel width, and makes the memory cells of the semiconductor memory device be separated into several blocks. The blocking of the memory cells reduces the power consumption of the semiconductor memory device, and the transistor with the large channel width improves the reading speed of the semiconductor memory device. However, the transistor with a large channel width included in the conventional semiconductor memory device adds parasitic capacitance impedance to the data transmission line, to limit the data transmission speed from the memory cell to the output buffer and the reading speed of the semiconductor memory device. The above problem of the conventional semiconductor memory device is described with reference to FIGS. 1 and 2.

Figure 1:
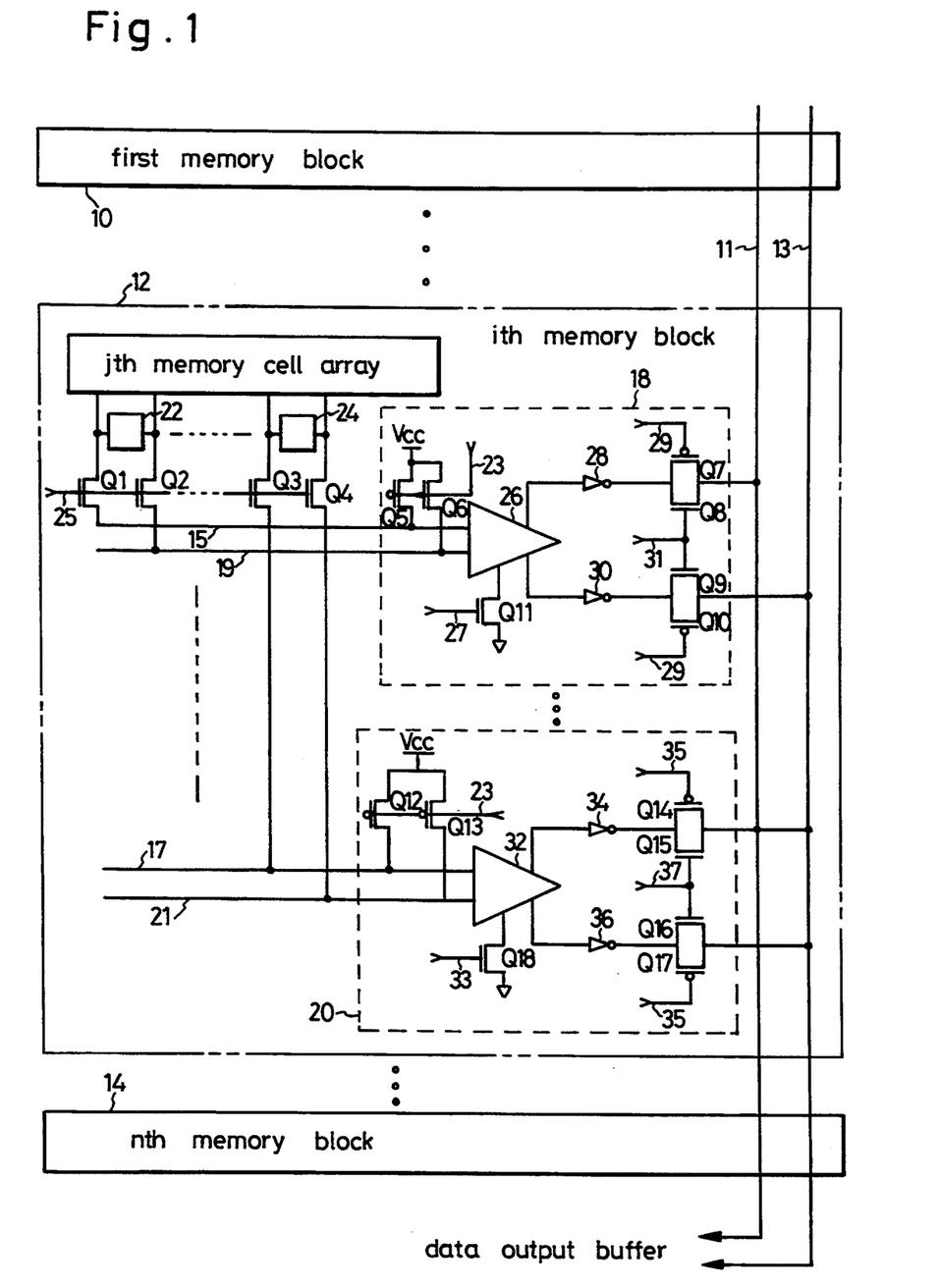
FIG. 1 is a circuit diagram of a conventional semiconductor memory device.

FIG. 1 illustrates a conventional semiconductor memory device having first to nth memory blocks 10 to 14 in common connected to a true data transmission line 11 and a complementary data transmission line 13. Each of the first to nth memory blocks 10 to 14 includes j memory cell arrays each of which is composed of i memory cells for storing data, i data transmission stages for transmitting data from memory cells of the j memory cell arrays the true and complementary data transmission lines, i true block data lines for transmitting true data read out from each memory cell of the j memory cell arrays to the i data transmission stages, and i complementary block data lines for transmitting complementary data read out from each memory cell of the j memory cell arrays the i data transmission stages. Each of the first to nth memory blocks 10 to 14 further comprises i×j sense amplifiers respectively connected to the i×j memory cells for sensing and amplifying true and complementary data read out from the memory cells, i×j data switching NMOS transistors for switching amplified true data from the i×j sense amplifiers to the i true block data lines, and i×j data switching NMOS transistors for switching amplified complementary data from the i×j sense amplifiers to the i complementary block data lines. However, for the convenience of description, it is assumed that the ith memory block 12 has the jth memory cell array 16, i sense amplifiers and 24 respectively connected to i memory cells of the jth memory cell array 16, i data switching NMOS transistors Q1 and Q3 for respectively switching amplified true data from the i sense amplifiers 22 and 24 to the i true block data lines 15 and 17, i data switching NMOS transistors Q2 and Q4 for switching amplified complementary data from the sense amplifiers 22 and 24 to the complementary block data lines 19 and 21, and i data transmission stages 18 and 20 for respectively transmitting true and complementary data from the i true and complementary block data lines 15 to 21 to the true and complementary data transmission lines 11 and 13.

Figure 2A:
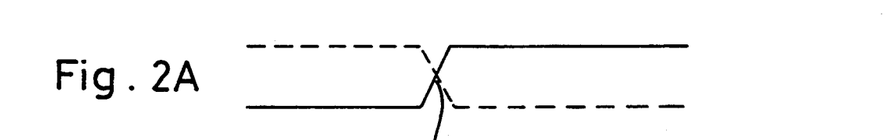
FIGS. 2A to 2F are operating waveform diagrams at the respective portions shown in FIG. 1.
Figure 2B:
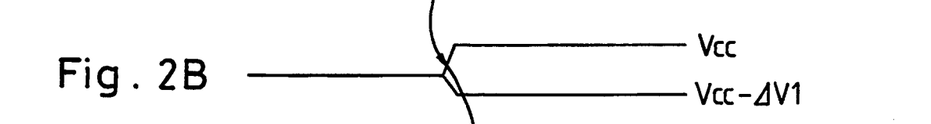

The first data transmission stage 18 included in the jth memory block 12 has two PMOS transistors Q5 and Q6 driven in response to a first pre-charge enable signal PRC supplied via a first control line 23. The two PMOS transistors Q5 and Q6 are turned on to supply a first power supply voltage Vcc from a first power supply Vcc to first true and complementary block data lines 15 and 19, when the pre-charge enable signal PRC has low logic (i.e., when the ith memory block 12 is selected). The first true and complementary block data lines 15 and 19 are pre-charged to the same voltage level as the first power supply voltage Vcc, until a jth column enable signal CEj supplied to the second control line 25 is changed from low logic to high logic as shown in FIG. 2A. With the jth column enable signal CEj of high logic, the true data generated in the first true block data line 15 has the same voltage level as the first power supply voltage Vcc as shown in FIG. 2B, when the first memory cell of the jth memory cell array 16 stores "1". Contrarily, when the first memory cell of the jth memory cell array 16 stores "0", a true data signal having a voltage level Vcc-$\Delta$V1 voltage-divided by the impedance of the NMOS transistor Q1 and the PMOS transistor Q5 is generated in the first true block data line 15. Also, with the jth column enable signal CEj of high logic, the complementary data generated in the first complementary block data line 19 has the same voltage level as the first power supply voltage Vcc, when the first memory cell of jth memory cell array 16 stores "0". When the first memory cell of the jth memory cell array 16 stores "1", a complementary data signal in a voltage level Vcc-$\Delta$V1 voltage-divided by the impedance of the NMOS transistor Q2 and the PMOS transistor Q6 is generated in the first complementary block data line 19.

Figure 2C:
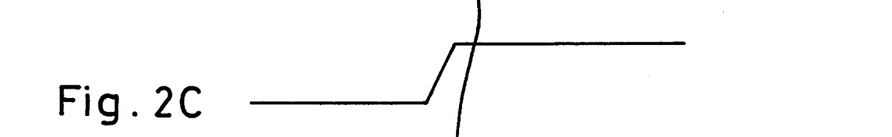
Figure 2D:
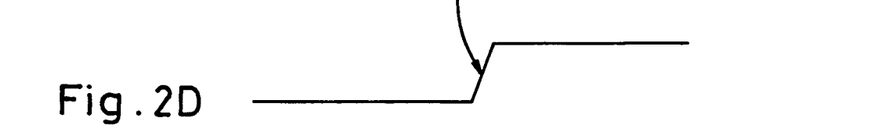
Figure 2E:
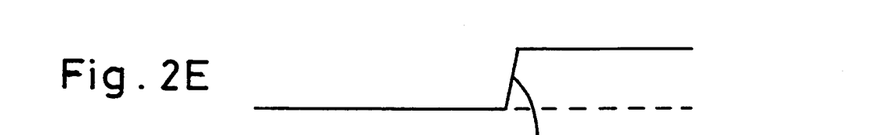
Figure 2F:
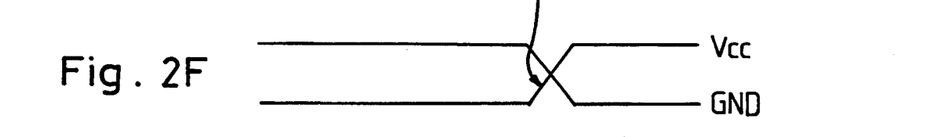

The first data transmission stage 18 additionally has a NMOS transistor Q11 receiving the first amplification enable signal AE1 via a third control line 27 and a bit sense amplifier 26 driven by the NMOS transistor Q11. When the first amplification enable signal AE1 has high logic as shown in FIG. 2C, the NMOS transistor Q11 is turned on to supply the second power supply voltage GND from the second power supply GND to the bit sense amplifier 26. While the second power supply voltage GND is supplied via the NMOS transistor Q11, the bit sense amplifier 26 inverts and amplifies true and complementary data signals from the first true and complementary block data lines 15 and 19 and supplies the inverted and amplified true and complementary data signals to the first and second inverters 28 and 30, respectively. The true data generated in the bit sense amplifier 26 has high logic as shown in FIG. 2D, when "0" is stored in the first memory cell of the jth memory cell array 16. The inverted and amplified complementary data has high logic as shown in FIG. 2D, when "1" is stored in the first memory cell of the jth memory cell array 16. The first inverter 28 inverts the inverted and amplified true data signal from the bit sense amplifier 26 and supplies the inverted signal to drains of PMOS transistor Q7 and NMOS transistor Q8 constituting a parallel circuit. The PMOS transistor Q7 supplies the true data from the first inverter 28 to the true data transmission line 11 in response to the first data output enable bar signal DOEB1 of low logic supplied to its gate from the fourth control line 29. The NMOS transistor Q8 supplies the true data signal from the first inverter 28 to the true data transmission line 11 in response to the first data output enable signal DOE1 of high logic, such as FIG. 2E, supplied to its gate from the fifth control line 31. Meanwhile, the second inverter 30 inverts the inverted and amplified complementary data signal supplied from the bit sense amplifier 26 and supplies the inverted signal to the drains of PMOS transistor Q10 and NMOS transistor Q9 constituting a parallel circuit. The PMOS transistor Q10 supplies a complementary data signal from the third inverter 30 to the complementary data transmission line 13 in response to a first data output enable bar signal DOEB1 of low logic supplied to its gate from the fourth control line 29. The NMOS transistor Q9 supplies the complementary data signal from the second inverter 30 to the complementary data transmission line 13 in response to the first data output enable signal DOE1 of high logic supplied to its gate from the fifth control lien 31. As a result, the four MOS transistors Q7 to Q10 transmit the true and complementary data from the first and second inverters 28 and 30 to the true and complementary data transmission lines 11 and 13, as shown in FIG. 2F.

Meanwhile, the ith data transmission stage 20 functions to transmit true and complementary data signals from the ith true and complementary block data lines 17 and 21 to the true and complementary data transmission lines 11 and 13. To do this, the ith data transmission stage 20 has a bit sense amplifier 32, two inverters 34 and 36, four PMOS transistors Q12 to Q14, and Q17, and three NMOS transistors Q15, Q16 and Q18, which respectively have the same constitutions as those of the first data transmission stage 18. The description of the ith data transmission stage 20 is omitted since it has the same constitution and function except that the ith amplification enable signal AEi, data output enable bar signal DOEBi, and data output enable signal DOEi are entered from the sixth to eighth control lines 33 to 37, instead of the first amplification enable signal AE1, the first data output enable bar signal DOEB1, and the first data output enable signal DOE1 entering the first data transmission stage 18.

As described above, the conventional semiconductor memory device can rapidly transmit the data to the data transmission lines by the pairs of MOS transistors Q7 to Q10, and Q14 to Q17 having large channel width and connected in parallel. However, the conventional semiconductor memory device limits the transmission speed of data on the data transmission line to below a predetermined threshold speed due to the capacitance impedance of MOS transistors Q7 to Q10, and Q14 to Q17 with the large channel width, and cannot improve the reading speed to above a predetermined threshold speed.

SUMMARY OF THE INVENTION

It is the objective of the present invention to provide a semiconductor memory device having an improved data transmission circuit that can improve the data reading speed.

To achieve this objective, the semiconductor memory device having the improved data transmission circuit comprises a plurality of memory cells for storing data, true and complementary data transmission lines for transmitting true and complementary data read out from the plurality of memory cells to an output buffer, a first voltage source for supplying a first voltage level to the true and complementary data transmission lines, first level shifting means being connected between the true data transmission line and a second voltage source generating a second voltage level for shifting the first voltage level of the true data transmission line to a third voltage level by true data of predetermined logic value supplied from the plurality of memory cells, and second level shifting means being coupled between the complementary data transmission line and the second voltage source for shifting the first voltage level of the complementary data transmission line to the third voltage level by the complementary data of predetermined logic value supplied from the plurality of memory cells.

BRIEF DESCRIPTION OF THE DRAWINGS

The above objective and other advantage of the present invention will become more apparent by describing the preferred embodiment of the present invention with reference to the attached drawings, in which.

DETAILED DESCRIPTION OF THE INVENTION

Figure 3:
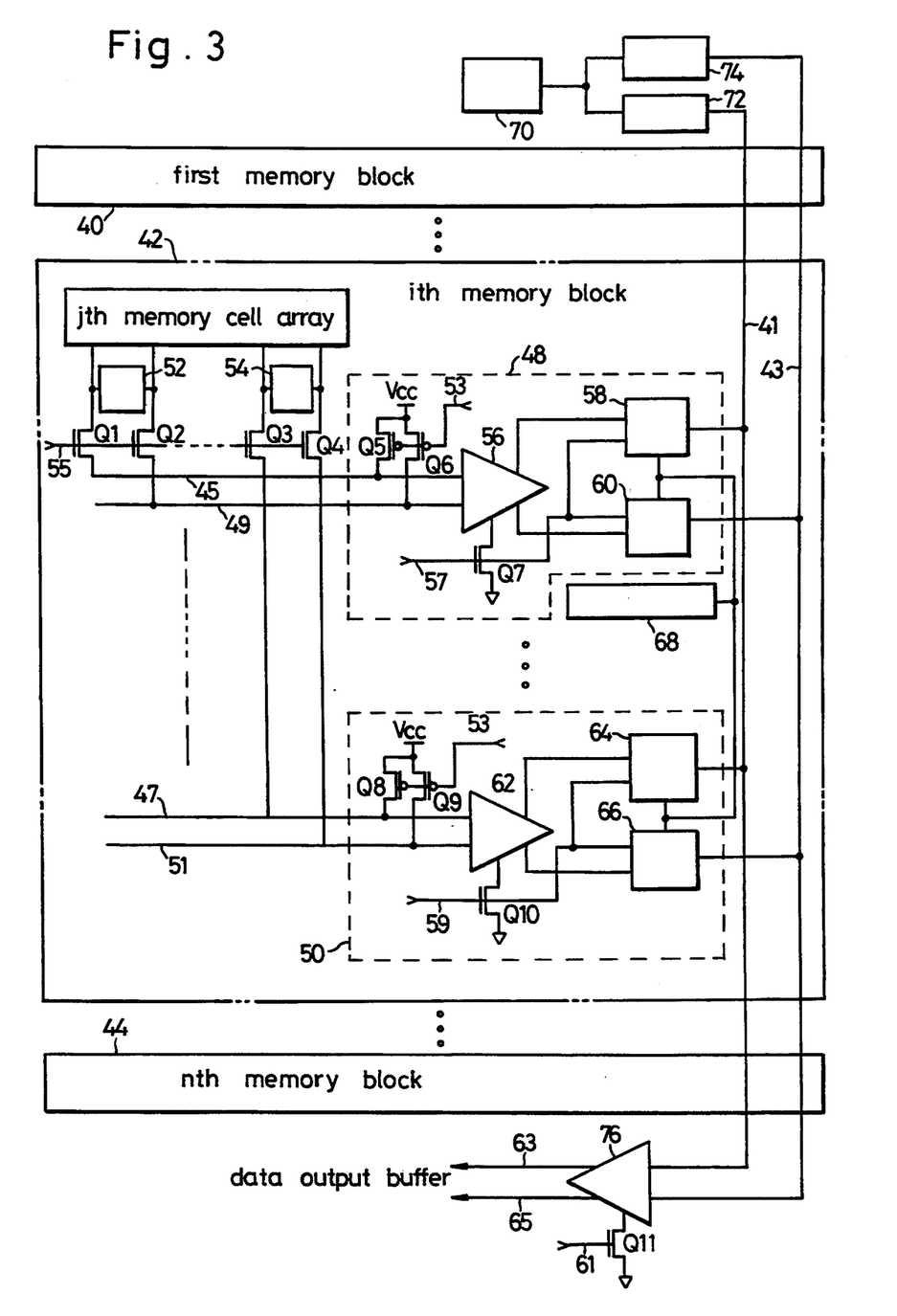
FIG. 3 is a block diagram of a semiconductor memory device having an improved data transmission circuit according to an embodiment of the present invention.

Refering now to FIG. 3, a semiconductor memory device having an improved data transmission circuit according to the embodiment of the present invention which has first to nth memory blocks 40 to 44 in common connected to a true data transmission line 41 and a complementary data transmission line 43 is illustrated. The first to nth memory blocks 40 to 44 have j memory cell arrays, each of which is composed of i memory cells, for storing data, i data transmission stages, i true and complementary block data lines, i ×j sense amplifiers, and the i×j pairs of data switching NMOS transistors, respectively, as in the first to nth memory blocks 10 to 14 shown in FIG. 1. However, for the convenience of description, it is assumed that the ith memory block 42 comprises the jth memory cell array 46 consisting of i memory cells, i sense amplifiers 52 and 54 respectively connected to the i memory cells of the jth memory cell array 46, i data switching NMOS transistors Q1 and Q3 for respectively switching amplified true data from the i sense amplifiers 52 and 54 to the i true block data lines 45 and 47, i data switching NMOS transistors Q2 and Q4 for respectively switching the amplified complementary data from the i sense amplifiers 52 and 54 to the complementary block data lines 49 and 51, i data transmission stages 48 and 50 for respectively transmitting the true and complementary data from the i true and complementary block data lines 45 to 51 to the true and complementary data transmission lines 41 and 43, and a first power supply 68 for supplying a first logic voltage to the i data transmission stages 48 and 50.

The semiconductor memory device further comprises a second power supply 70 for supplying a first power supply voltage to the true and complementary data transmission lines 41 and 43 via the first and second load resistors 72 and 74, respectively, and a read amplifier 76 for amplifying true and complementary data from the true and complementary data transmission lines 41 and 43. The read amplifier 76 amplifies the true and complementary data to increase the voltage swing width of true and complementary data supplied from the true and complementary data transmission lines 41 and 43. The read amplifier 76 supplies the amplified true and complementary data to an output buffer (not shown) via the true and complementary output lines 63 and 65. The NMOS transistor Q11 for switching the third power supply voltage GND to be supplied to the read amplifier 76 is driven in response to a read enable signal RE from the fifth control line 61. The NMOS transistor Q11 supplies the third power supply voltage GND from the third power supply GND to the read amplifier 76 to operate the read amplifier 76, when the read enable signal has high logic.

The first data transmission stage 58 included in the ith memory block 42 has two PMOS transistors Q5 and Q6 driven in response to a pre-charge enable signal PRC supplied via the first control line 53, and a NMOS transistor Q7 for receiving the first amplification enable signal AE1 via the third control line 57. The two PMOS transistors Q5 and Q6 are turned on to supply the fourth power supply voltage Vcc from the fourth power supply Vcc to the first true and complementary block data lines 45 and 49, when the pre-charge enable signal PRC has low logic (i.e., when the ith memory block 42 is selected). The NMOS transistor Q7 is turned on to supply the third power supply voltage GND from the third power supply GND to the bit sense amplifier 56, when the first amplification enable signal AE1 has high logic. The bit sense amplifier 56 amplifies the true and complementary data signals supplied from the first true and complementary block data lines 45 and 49, while the third power supply voltage GND is supplied via the NMOS transistor Q7. The bit sense amplifier 56 receives the true and complementary data from the first memory cell of the jth memory cell array 46 via the sense amplifier 52, the two NMOS transistors Q1 and Q2, and the true and complementary block data lines 45 and 49, when the data switching NMOS transistors Q1 and Q2 are turned on in response to a jth column enable signal CEj from the second control line 55. Also, the bit sense amplifier 56 receives the true and complementary data from the first memory cell of the first memory cell array (not shown), when a first column enable signal CE1 (not shown) has high logic. The amplified true and complementary data generated in the bit sense amplifier 56 have the high logic of the fourth power supply voltage Vcc and the low logic of the third power supply voltage GND.

The first data transmission stage 48 additionally has two current controllers 58 and 60 for respectively receiving the amplified-true and complementary data supplied from the bit sense amplifier 56. The two current controllers 58 and 60 are operated while the first amplification enable signal AE1 supplied from the second control line 55 has high logic. The current controller 58 supplies to the second power supply 68 the second power supply voltage supplied to the true data transmission line 41, according to the logic value of the amplified true data from the bit sense amplifier 56. In detail, the current controller 58 connects the true data transmission line 41 to the second power supply 68 to form a current path of the first power supply voltage, when the amplified true data has high logic. When the true data transmission line 41 is connected to the second power 68, the true data signal supplied to the read amplifier 76 from the true data transmission line 41 has the voltage level determined by the following equation:

$$V41 = (V1 - V2)R58/(R58 + R72) \quad (1)$$

In Eq.(1), V1 and V2 represents first and second power supply voltages, R58 represents an internal resistance of the current controller 58, and R72 represents a resistance of the load resistor 72.

Similarly, the current controller 60 connects the complementary data transmission line 43 to the second power supply 68 to form a current path of the first power supply voltage, when the amplified complementary data from the bit sense amplifier 56 has high logic. When the complementary data transmission line 43 is connected to the second power supply 68, the complementary data signal transmitted to the read amplifier 76 from the complementary data transmission line 43 has the voltage level determined by the following equation:

$$V43 = (V1 - V2)R60/(R60 + R74) \quad (2)$$

In Eq. (2), V1 and V2 are first and second power supply voltages, R60 is an internal resistance of the current controller 60, and the R74 is the resistance of the load resistor 74. The resistances of the load resistor 72 and the current controller 58 have the same values as the resistances of the load resistor 74 and the current controller 60, so that the voltage V43 of the complementary data signal has the same level as the voltage V41 of the true data signal. As a result, the true and complementary data signals transmitted on the true and complementary data transmission lines 41 and 43 have the small voltage swing widths such as V1–V41, V1–V43.

Meanwhile, the ith data transmission stage 50 functions to transmit the true and complementary data signals from the ith true and complementary block data lines 47 and 51 to the true and complementary data transmission lines 41 and 43. To do this, the ith data transmission stage 50 has a bit sense amplifier 62, two current controllers 64 and 66, two PMOS transistors Q8 and Q9, and a NMOS transistor Q10, which respectively have the same constitutions as those of the first data transmission stage 48. The description of the ith data transmission stage 50 is omitted since the ith data transmission stage 50 has the same constitution and function except that the ith amplification enable signal AEi is received from the fourth control line 59, instead of the first amplification enable signal AE1 received in the first data transmission stage 48.

Figure 4:
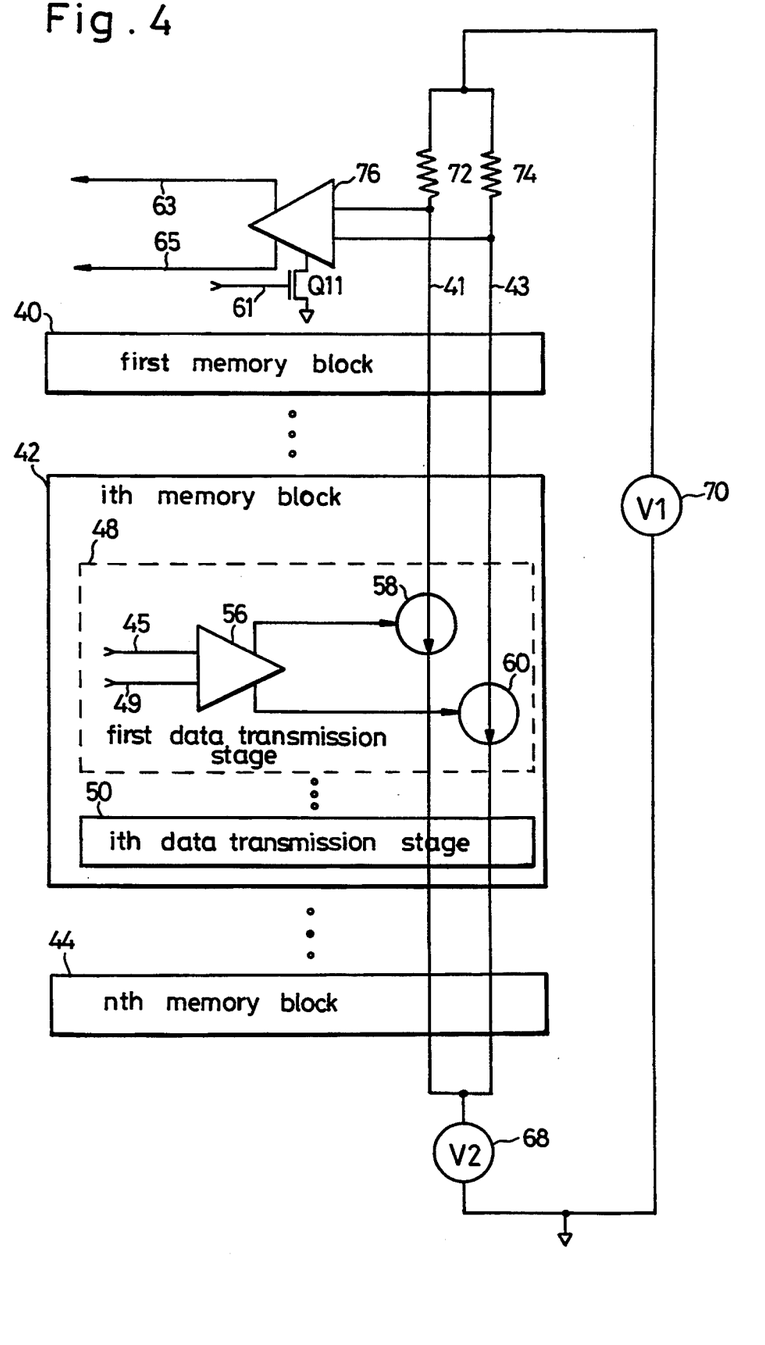
FIG. 4 is an equivalent circuit diagram of the semiconductor memory device shown in FIG. 3.

FIG. 4 shows an equivalent diagram of a semiconductor memory device shown in FIG. 3, when the data read in the first memory cell of the jth memory cell array 46 of the ith memory block 42 is transmitted to the output buffer. In FIG. 4, n−1 memory blocks 40 and 44 except for the ith memory block 42 are not driven. In the ith memory block 42, the i−1 data transmission stages 50, except for the first data transmission stage 48, are not driven. Meanwhile, the bit sense amplifier 56 included in the first data transmission stage 48 is driven by the third power supply voltage GND supplied via the NMOS transistor Q7 and amplifies the true and complementary data from the first true and complementary block data lines 45 and 49. The bit sense amplifier 56 supplies the amplified true and complementary data X and Y to the two current controllers 58 and 60. Then, the current controller 58 driven by the amplified true data X and the current controller 60 driven by the amplified complementary data Y form a current path from the first power supply 70 to the second power supply 68 via the load resistor 72, the true data transmission line 41, and the current controller 58, and a current path from the first power supply 70 to the second power supply 68 via the load resistor 74, the complementary data transmission line 43, and the current controller 60. The impedances of the two current controllers 58 and 60 have an infinite value and a predetermined value according to the logic of the amplified data. As an example, when the amplified true data has a logic value of "1" and the amplified complementary data has a logic value of "0", the impedance R58 of the current controller 58 has a predetermined impedance value and, on the other hand, the impedance of the current controller 60 has an infinite value. At this time, the voltage V41 of the true data signal transmitted on the true data transmission line 41 is determined by Eq.(1), and the voltage V43 of the complementary data signal transmitted on the complementary data transmission line 43 has the first power supply voltage V1. Contrarily, when the amplified true data has a logic value of "0" and the amplified complementary data has a logic value of "1", the impedance R60 of the current controller 60 has a predetermined impedance value and the impedance, R58 of the current controller 58 has an infinite value. At this time, the voltage V41 of the true data signal transmitted on the true data transmission line 41 has a first power supply voltage V1, and the voltage V43 of the complementary data signal transmitted on the complementary data transmission line 43 is determined by Eq.(2). The parasitic capacitance components included in the impedance R58 and R60 of the current controllers 58 and 60 are minimized if the current controllers 58 and 60 include MOS transistor having a narrow channel width. The voltages of the true and complementary data signals determined by Eqs. (1) and (2) are properly set by adjusting the resistances of the load resistors 72 and 74.

Figure 5:
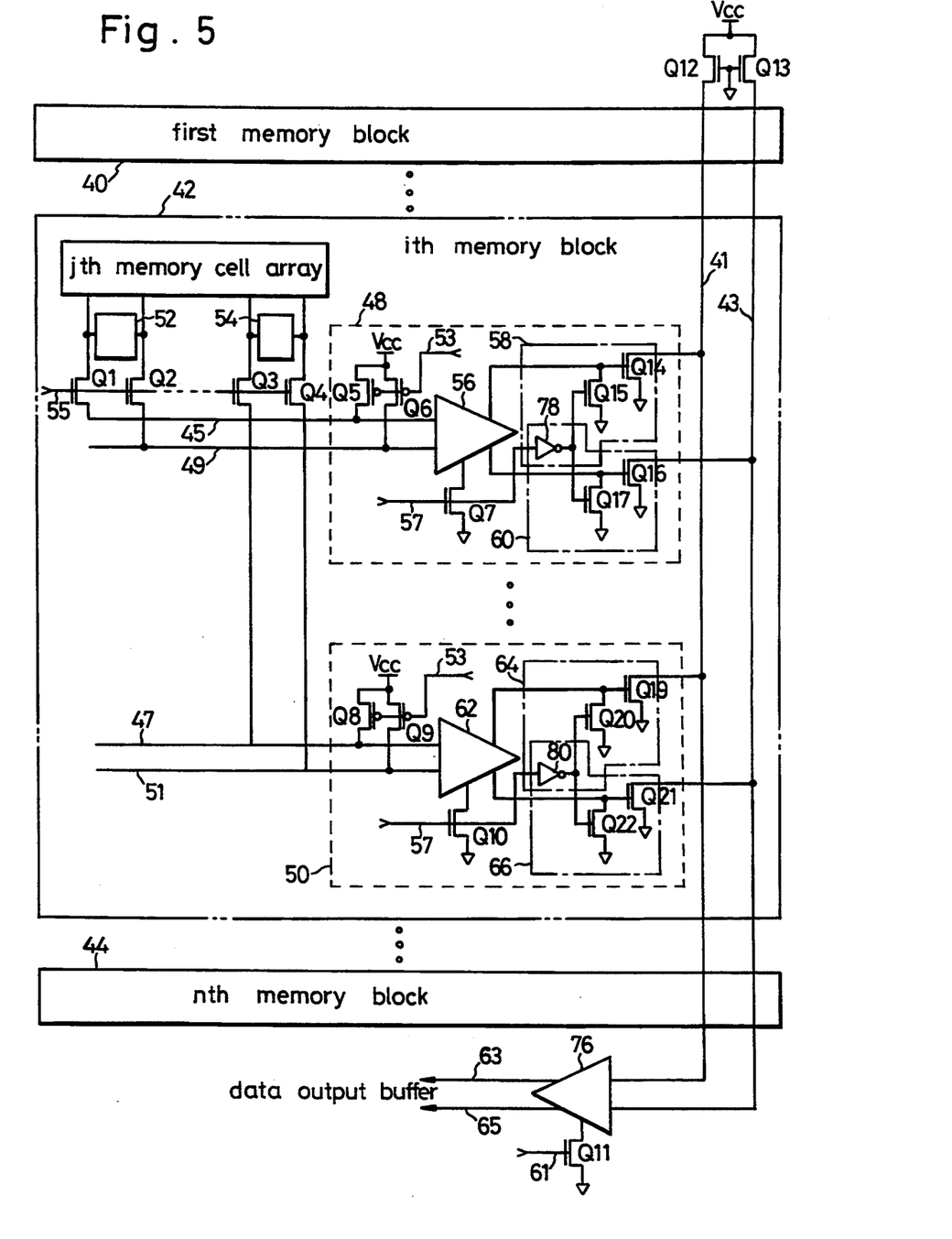
FIG. 5 is a detailed circuit diagram of the semiconductor memory device shown in FIG. 3.

FIG. 5 describes in detail the semiconductor memory device shown in FIG. 3 which has the first to nth memory blocks 40 to 44 in common connected to the true data transmission line 41 and the complementary data transmission line 43, a PMOS transistor Q12 connected between the true data transmission line 41 and the first power supply Vcc, and the PMOS transistor Q13 connected between the complementary data transmission line 43 and the first power supply Vcc. The two PMOS transistors Q12 and Q13 are turned on by the second power supply voltage GND from the second power supply GND supplied at their gates, and supply the first power supply voltage Vcc from the first power supply Vcc to the true and complementary data transmission lines 41 and 43. The two PMOS transistors Q12 and Q13 serve as load resistors of the true and complementary data transmission lines 41 and 43, respectively. The ith memory block 42 has, as in the assumption of FIG. 3, a jth memory cell array 46 composed of i memory cells, i sense amplifiers 52 and 54 respectively connected to i memory cells of the jth memory cell array 46, i data switching NMOS transistors Q1 and Q3 respectively supplying the amplified true data from the i sense amplifiers 52 and 54 to the i true block data lines 45 and 47, i data switching NMOS transistors Q2 and Q4 for respectively supplying the amplified complementary data from the i sense amplifiers 52 and 54 to the complementary block data lines 49 and 51, and i data transmission stages 48 and 50 for respectively transmitting the true and complementary data from the i true and complementary block data lines 45 to 51 to the true and complementary data transmission lines 41 and 43.

Figure 6A:
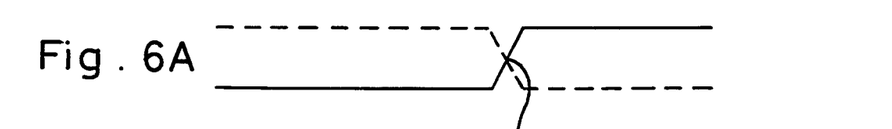
FIGS. 6A to 6G are operating waveform diagrams at the respective portions of the semiconductor memory device shown in FIG. 5.
Figure 6B:
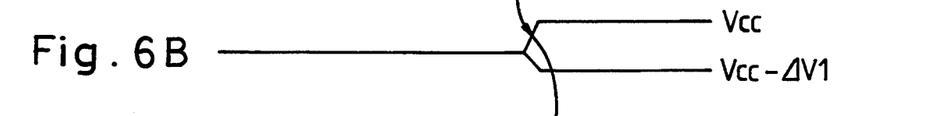

The first data transmission stage 58 included in the ith memory block 42 comprises two PMOS transistors Q5 and Q6 driven by a pre-charge enable signal PRC supplied via the first control line 53. When the pre-charge enable signal PRC has low logic (i.e., when the ith memory block 42 is selected), the two PMOS transistors Q5 and Q6 are turned on. The two PMOS transistors Q5 and Q6 supply the first power supply voltage Vcc from the first power-supply Vcc to the first true and complementary block data lines 45 and 49 respectively. The first true and complementary block data lines 45 and 49 are pre-charged to the same voltage level as the first power supply voltage Vcc, until the jth column enable signal CEj supplied to the second control line 55 changes from the low logic to the high logic as shown in FIG. 6A. With the jth column enable signal CEj of high logic, the true data generated in the first true block data line 45 has the same voltage level as the first power supply voltage Vcc as shown in FIG. 6B, when the first memory cell of the jth memory cell array 46 stores "0". Contrarily, when the first memory cell of the jth memory cell array 46 stores "1", a true data signal of a voltage level Vcc-ΔV1 voltage-divided by the impedance of NMOS transistors Q1 and PMOS transistor Q5 is generated in the first true block data line 45. Also, with the jth column enable signal CEj of high logic, the complementary data generated in the first complementary block data line 49 has the same voltage level as the first power supply voltage Vcc, when the first memory cell of the jth memory cell array 46 stores "0". Contrarily, when the first memory cell of the jth memory cell array 46 stores "1", the complementary data signal of voltage level Vcc-ΔV1 voltage-divided by the impedance of NMOS transistor Q2 and PMOS transistor Q6 is generated in the first complementary block data line 49.

Figure 6C:
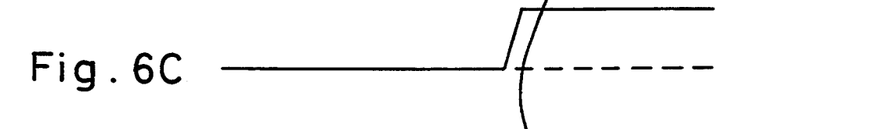
Figure 6D:
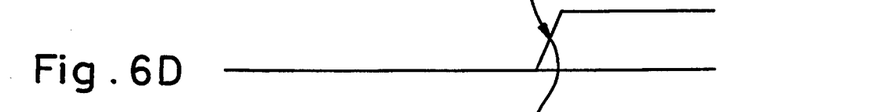

Also, the first data transmission stage 48 includes a NMOS transistor Q7 for receiving the first amplification enable signal AE1 via the third control line 57, and a bit sense amplifier 56 for amplifying true and complementary data from the first true and complementary block data lines 45 and 49. When data read from the first memory cells of the first to jth memory cell arrays are transmitted to the output buffer, the first amplification enable signal AE1 has high logic. When the first amplification enable signal AE1 shown in FIG. 6C has high logic, the NMOS transistor Q7 is turned on to supply the second power supply voltage GND from the second power supply GND to the bit sense amplifier 56. While the second power supply voltage GND is supplied via the NMOS transistor Q7, the bit sense amplifier 56 amplifies the true and complementary data signals from the first true and complementary block data lines 45 and 49. When the data switching NMOS transistors Q1 and Q2 are turned on by the jth column enable signal CEj from the second control line 55, the bit sense amplifier 56 receives the true and complementary data from the first memory cell of the jth memory cell array 46 via the sense amplifier 52, the two NMOS transistors Q1 and Q2, and the true and complementary block data lines 45 and 49. Also, when the first column enable signal CE1 (not shown) has high logic, the bit sense amplifier 56 receives the true and complementary data from the first memory cell of the first memory cell array (not shown). The amplified true and complementary data generated in the bit sense amplifier 56 respectively have high logic of the first power supply voltage Vcc and low logic of the second power supply voltage GND, as shown in FIG. 6D.

The first data transmission stage 48 additionally includes a current controller 58 composed of a NMOS transistor Q14 connected between the true data transmission line 41 and the second power supply GND, and an inverter for receiving the first amplification enable signal AE1 from the third control line 57. When the amplified true data supplied to its gate from the bit sense amplifier 56 has high logic, the NMOS transistor Q14 connects the true data transmission line 41 to the second power 68 to form a current path of the first power supply voltage. When the true data transmission line 41 is connected to the second power supply 68, the true data signal transmitted from the true data transmission line 41 to the read amplifier 76 has a voltage level determined by the following Eq. (3):

$$V41 = (R14 \times Vcc)/R14 + R12) \tag{3}$$

In Eq. (3), R12 is a resistance determined by a channel width of the PMOS transistor Q12, and R14 is a resistance determined by a channel width of the NMOS transistor Q14. The NMOS transistor Q14 has a very small channel width to minimize the parasitic capacitance impedance to be added in the true data transmission line 41. When the NMOS-transistor Q14-is turned on, the channel width of the PMOS transistor Q12 is properly adjusted to set a voltage level of the true data transmission line 41. The inverter 78 inverts the first amplification enable signal AE1 supplied from the third control line 57 and supplies the inverted first amplification enable signal /AE1 to gates of two NMOS transistors Q15 and Q17. When the inverted first amplification enable signal /AE1 has high logic, the NMOS transistor Q15 is turned on. The NMOS transistor Q15 supplies the second power supply voltage GND from the second power supply GND to the gate of the NMOS transistor Q14, thereby preventing the false operation of the NMOS transistor Q14.

The current controller 60 included in the data transmission stage 56 also includes a NMOS transistor Q16 connected between the complementary data transmission line 43 and the second power supply GND. When the amplified complementary data supplied to its gate from the bit sense amplifier 56 has high logic, the NMOS transistor Q16 connects the complementary data transmission line 43 to the second power supply GND to form a current path of the first power supply voltage Vcc. When the complementary data transmission line 43 is connected to the second power supply GND, the complementary data signal transmitted on the complementary data transmission line 43 has the voltage level determined by the following Eq.(4):

$$V41 = (R16 \times Vcc)/R16 + R13) \tag{4}$$

Figure 6E:
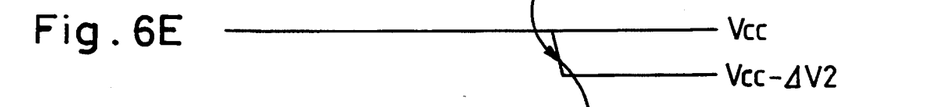

In Eq.(4), R13 is a resistance determined by a channel width of the PMOS transistor Q13, and R16 is a resistance determined by a channel width of the NMOS transistor Q16. The NMOS transistor Q16 has a very small channel width to minimize parasitic capacitance impedance added to the complementary data transmission line 43. When the NMOS transistor Q16 is turned on, the channel width of the PMOS transistor Q13 is properly adjusted to set a voltage level of the complementary data transmission line 43. The channel widths of NMOS transistor Q16 and PMOS transistor Q13 are set to have the same channel widths as the NMOS transistor Q14 and he PMOS transistor Q12. When the inverted first amplification enable signal /AE1 has high logic, the NMOS transistor Q17 is turned on. The NMOS transistor Q17 supplies the second power supply voltage GND from the second power supply GND to the gate of the NMOS transistor Q16, thereby preventing the false operation of the NMOS transistor Q16. As a result, the true and complementary data transmitted to the true and complementary data transmission lines 41 and 43 have logic voltages Vcc and V43(or V41), or V41(or V43) and Vcc as shown in FIG. 6E, by two NMOS transistors Q14 and Q16 complementarily operated. The true and complementary data transmitted to the true and complementary data transmission lines 41 and 43 have a smaller voltage swing width than that of the first power supply voltage Vcc.

When the ith amplification enable signal AEi supplied via the fourth control line 59 has high logic, the ith data transmition stage 50 included in the ith memory block 42 is operated as in the first data transmission stage 48, to transmit the true and complementary data from the ith true and complementary block data lines 47 and 51 to the true and complementary data transmission lines 41 and 43. When the data read from the ith memory cells of the first to jth memory cell arrays are transmitted to the output buffer, the ith amplification enable signal AEi has high logic. The ith data transmission stage 50 has a bit sense amplifier 62, an inverter 80, two PMOS transistors Q8 and Q9, and five NMOS transistors Q10, Q18 to Q21, which respectively have the same constitutions as those of the first data transmission stage 48.

Figure 6F:
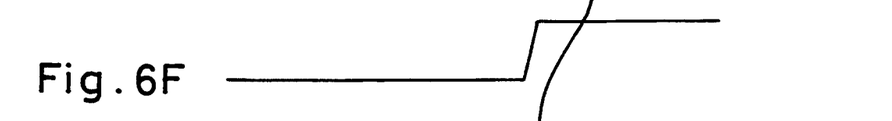
Figure 6G:
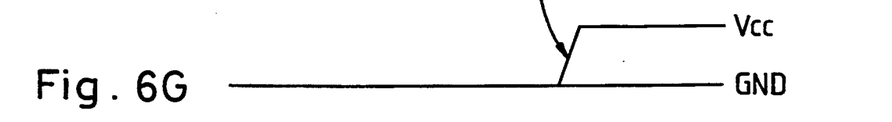

The semiconductor memory device additionally includes a read amplifier 76 for receiving true and complementary data from the true and complementary data transmission lines 41 and 43, and a NMOS transistor Q11 for receiving a read enable signal RE from the fifth control line 61. The NMOS transistor Q11 is driven according to the logic value of the read enable signal RE from the fifth control line 61. When the read enable signal RE shown in FIG. 6F has high logic, the NMOS transistor Q11 supplies the second power supply voltage GND from the second power supply GND to the read amplifier 76, to operate the read amplifier 76. The read amplifier 76 inverts and amplifies the true and complementary data to increase the voltage swing width of the true and complementary data supplied from the true and complementary data transmission lines 41 and 43. The read amplifier 76 supplies the amplified true and complementary data to the output buffer (not shown) via the true and complementary output lines 63 and 65. The inverted and amplified true and complementary data generated in the read amplifier 76 have high logic of the first power supply voltage Vcc and low logic of the second power supply voltage GND, as shown in FIG. 6G.

As described above, the semiconductor memory device having the improved data transmission circuit according to the present invention reduces the voltage swing width of the data signal transmitted in the data transmission line, to prevent the generation of parasitic capacitance impedance to be added to the data transmission line, and provides an advantage of improving the data transmission speed of the data transmission line. According to the improvement of data transmission speed in the data transmission line, the semiconductor memory device of the present invention provides an advantage of improving the data reading speed.

What is claimed is:

1. A semiconductor memory device having an improved data transmission circuit comprising:
   a plurality of memory cells for storing data;
   true and complementary data transmission lines for transmitting to output buffer true and complementary data supplied from said plurality of memory cells;
   a first voltage source of supplying a first voltage level to said true and complementary data transmission lines;
   first level shifting means being connected between said true data transmission line and a second voltage source generating a second voltage level for shifting a first voltage level of said true data transmission line to a third voltage level by true data of a predetermined logic value supplied from said plurality of memory cells, to reduce voltage swing of data on said true data transmission line; and
   second level shifting means being connected between said complementary data transmission line and said second voltage source for shifting a first voltage level of said complementary data transmission line to a third voltage level by complementary data of a predetermined logic value supplied from said plurality of memory cells, to reduce voltage swing of data on said complementary data transmission line.

2. A semiconductor memory device having an improved data transmission circuit as claimed in claim 1, further comprising third level shifting means for shifting data signal of said third voltage level supplied from said true and complementary data transmission lines to said first voltage level and/or a second voltage level.

3. A semiconductor memory device having an improved data transmission circuit as claimed in claim 2, wherein said first level shifting means comprises first impedance means connected between said first voltage source and said true data transmission line, and first controlling impedance means connected between said true data transmission line and said second voltage source and driven by true data of predetermined logic supplied from said plurality of memory cells, and
   said second level shifting means comprises second impedance means connected between said first voltage source and said complementary data transmission line, and second controlling impedance means connected between said complementary data transmission line and said second voltage source and driven by complementary data of predetermined logic supplied from said plurality of memory cells.

4. A semiconductor memory device having an improved data transmission circuit as claimed in claim 3, wherein said first and second controlling impedance means respectively comprise MOS transistors having very small channel width to prevent generation of parasitic capacitance impedance to be added to said true and complementary data transmission lines.

5. A semiconductor memory device having an improved data transmission circuit as claimed in claim 4, wherein a first voltage level generated in said first voltage source is a high potential, and a second voltage level generated in said second voltage source is a grounded potential.

6. A semiconductor memory device having an improved data transmission circuit as claimed in claim 5, wherein said MOS transistor is driven by data having first voltage level.

* * * * *